(12) United States Patent
Tichy

(10) Patent No.: US 8,714,368 B2
(45) Date of Patent: May 6, 2014

(54) PASS-THROUGH TROUGH

(75) Inventor: Dustin Tichy, Prior Lake, MN (US)

(73) Assignee: ADC Telecommunications, Inc., Berwyn, PA (US)

( * ) Notice: Subject to any disclaimer, the term of this patent is extended or adjusted under 35 U.S.C. 154(b) by 233 days.

(21) Appl. No.: 12/851,248

(22) Filed: Aug. 5, 2010

(65) Prior Publication Data

US 2011/0056895 A1 Mar. 10, 2011

Related U.S. Application Data

(60) Provisional application No. 61/240,711, filed on Sep. 9, 2009.

(51) Int. Cl.
*A47F 7/00* (2006.01)
*H05K 7/14* (2006.01)

(52) U.S. Cl.
CPC .............. *H05K 7/1488* (2013.01); *H05K 7/1491* (2013.01)
USPC ................................ 211/26; 385/135; 361/725

(58) Field of Classification Search
CPC ........................... G02B 6/4454; H05K 7/1489
USPC .................. 211/26; 385/134, 135; 312/223.1, 312/223.6, 334.23; 361/725, 825, 826
See application file for complete search history.

(56) References Cited

U.S. PATENT DOCUMENTS

| | | | |
|---|---|---|---|
| 3,573,560 A * | 4/1971 | Rogers ........................... | 361/609 |
| 3,573,561 A * | 4/1971 | Beebe ........................... | 361/609 |
| 5,946,440 A * | 8/1999 | Puetz ............................. | 385/135 |
| 5,966,492 A * | 10/1999 | Bechamps et al. ............ | 385/135 |
| 6,203,130 B1 | 3/2001 | Montgelas et al. | |
| 6,236,795 B1 * | 5/2001 | Rodgers ........................ | 385/134 |
| 6,870,734 B2 | 3/2005 | Mertesdorf et al. | |
| 6,944,383 B1 * | 9/2005 | Herzog et al. ................ | 385/123 |
| 6,944,389 B2 * | 9/2005 | Giraud et al. ................. | 385/135 |
| 7,002,810 B1 * | 2/2006 | Becker et al. ................. | 361/796 |
| 7,005,996 B2 * | 2/2006 | Cabrera et al. ............... | 340/639 |
| 7,244,131 B1 * | 7/2007 | Khemakhem et al. ........ | 439/188 |
| 7,397,996 B2 * | 7/2008 | Herzog et al. ................ | 385/135 |
| 7,409,137 B2 * | 8/2008 | Barnes .......................... | 385/135 |
| 7,454,116 B2 * | 11/2008 | Clark et al. ................... | 385/136 |
| 7,470,133 B2 * | 12/2008 | Khemakhem et al. ........ | 439/188 |
| 7,567,744 B2 * | 7/2009 | Krampotich et al. ......... | 385/135 |
| 7,570,860 B2 * | 8/2009 | Smrha et al. .................. | 385/135 |
| 7,593,613 B1 * | 9/2009 | Clark ............................. | 385/135 |

(Continued)

FOREIGN PATENT DOCUMENTS

WO  WO 2008/089190 A2  7/2008

OTHER PUBLICATIONS

International Search Report and Written Opinion mailed Dec. 1, 2010.

*Primary Examiner* — Darnell Jayne
*Assistant Examiner* — Hiwot Tefera
(74) *Attorney, Agent, or Firm* — Merchant & Gould P.C.

(57) ABSTRACT

A telecommunications system includes a rack, telecommunications equipment mounted to the rack, and a cross-through trough extending between a front and a rear of the rack. The cross-through trough includes a sliding shuttle for pulling cables between the front and the rear. The sliding shuttle includes a cable clip for releasably holding one or more cables during movement between the front and the rear. The cross-through trough can be one rack unit (RU) in height, if desired.

7 Claims, 10 Drawing Sheets

(56) References Cited

U.S. PATENT DOCUMENTS

| | | | |
|---|---|---|---|
| 7,606,459 B2* | 10/2009 | Zimmel et al. | 385/135 |
| 7,853,112 B2* | 12/2010 | Zimmel et al. | 385/135 |
| 8,193,448 B2* | 6/2012 | Syed | 174/68.1 |
| 8,353,714 B2* | 1/2013 | Khemakhem et al. | 439/188 |
| 8,494,332 B2* | 7/2013 | Rudenick et al. | 385/135 |
| 8,520,408 B2* | 8/2013 | Hruby et al. | 361/827 |
| 2002/0076970 A1* | 6/2002 | Nagel | 439/418 |
| 2005/0111810 A1* | 5/2005 | Giraud et al. | 385/135 |
| 2006/0044775 A1* | 3/2006 | Hoshino et al. | 361/796 |
| 2006/0176654 A1* | 8/2006 | Kfoury | 361/681 |
| 2006/0275008 A1* | 12/2006 | Xin | 385/135 |
| 2008/0175552 A1* | 7/2008 | Smrha et al. | 385/135 |
| 2008/0247723 A1* | 10/2008 | Herzog et al. | 385/135 |
| 2009/0022468 A1* | 1/2009 | Zimmel | 385/135 |
| 2009/0257726 A1 | 10/2009 | Redmann et al. | |
| 2010/0086267 A1* | 4/2010 | Cooke et al. | 385/100 |
| 2011/0275248 A1* | 11/2011 | Lee | 439/660 |
| 2013/0003317 A1* | 1/2013 | Gong et al. | 361/726 |

* cited by examiner

PASS-THROUGH TROUGH

CROSS-REFERENCE TO RELATED APPLICATIONS

This application claims the benefit of U.S. Provisional Application Ser. No. 61/240,711, filed Sep. 9, 2009; which application is incorporated herein by reference.

TECHNICAL FIELD

The present invention relates to a systems and methods for managing telecommunications cables.

BACKGROUND OF THE INVENTION

Various racks, frames, and cabinets are known for holding telecommunications equipment and managing the related telecommunications cables extending between the various pieces of equipment. Improvements are desired in the systems and methods for managing the cables.

SUMMARY OF THE INVENTION

The present invention relates to a telecommunications cable management chassis including an open front and an open rear, and a sliding shuttle that communicates between the open front and the open rear. The chassis is preferably mountable to a telecommunications rack, frame or cabinet. In one embodiment, two sliding shuttles are provided. The sliding shuttles allow for cables to be moved between the open front and the open rear by moving the sliding shuttle. The chassis can be mounted adjacent to telecommunications equipment, such as mounting the chassis below the equipment, for managing cables extending to and from the equipment. In one preferred embodiment, the chassis is one rack unit (RU) in height.

The present invention also relates to a method of managing cables wherein a chassis is provided in a system, and a sliding shuttle is used to move cables between the front and the back of the chassis.

DETAILED DESCRIPTION OF THE PREFERRED EMBODIMENT

Figure 1:
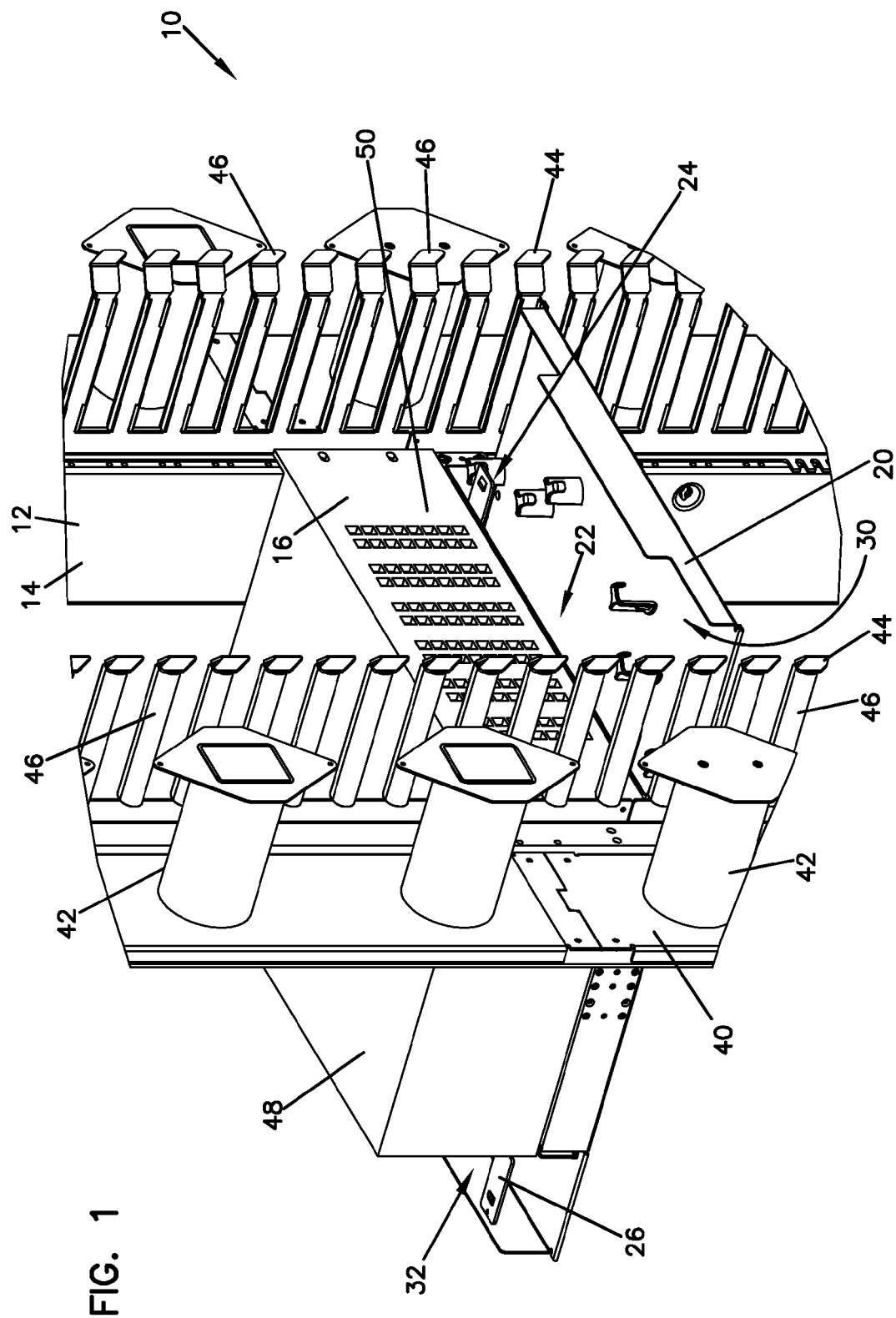
FIG. 1 is a top, front perspective view of a telecommunications system in accordance with the present invention.
Figure 2:
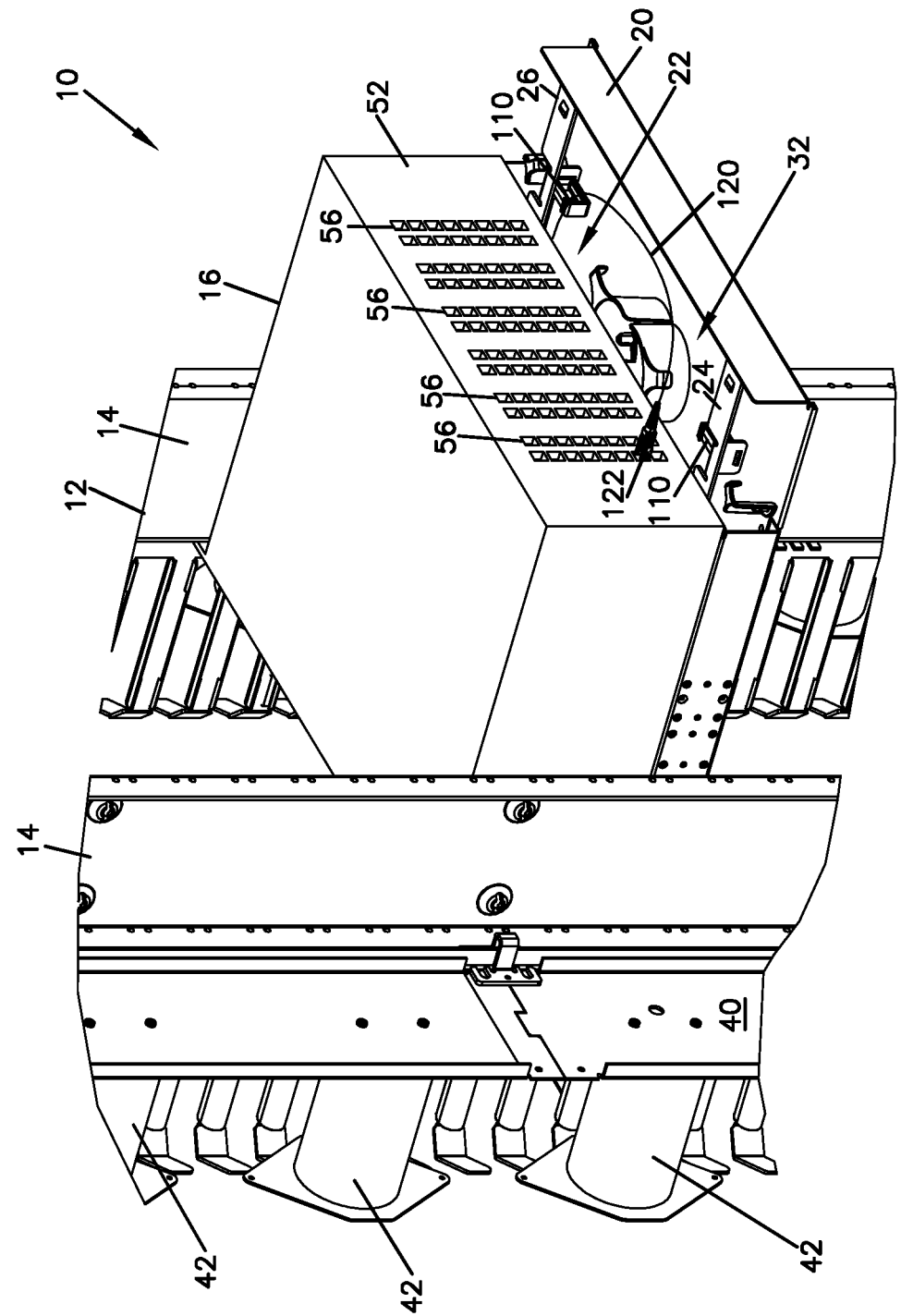
FIG. 2 is a top, rear perspective view of the telecommunications system of FIG. 1.
Figure 3:
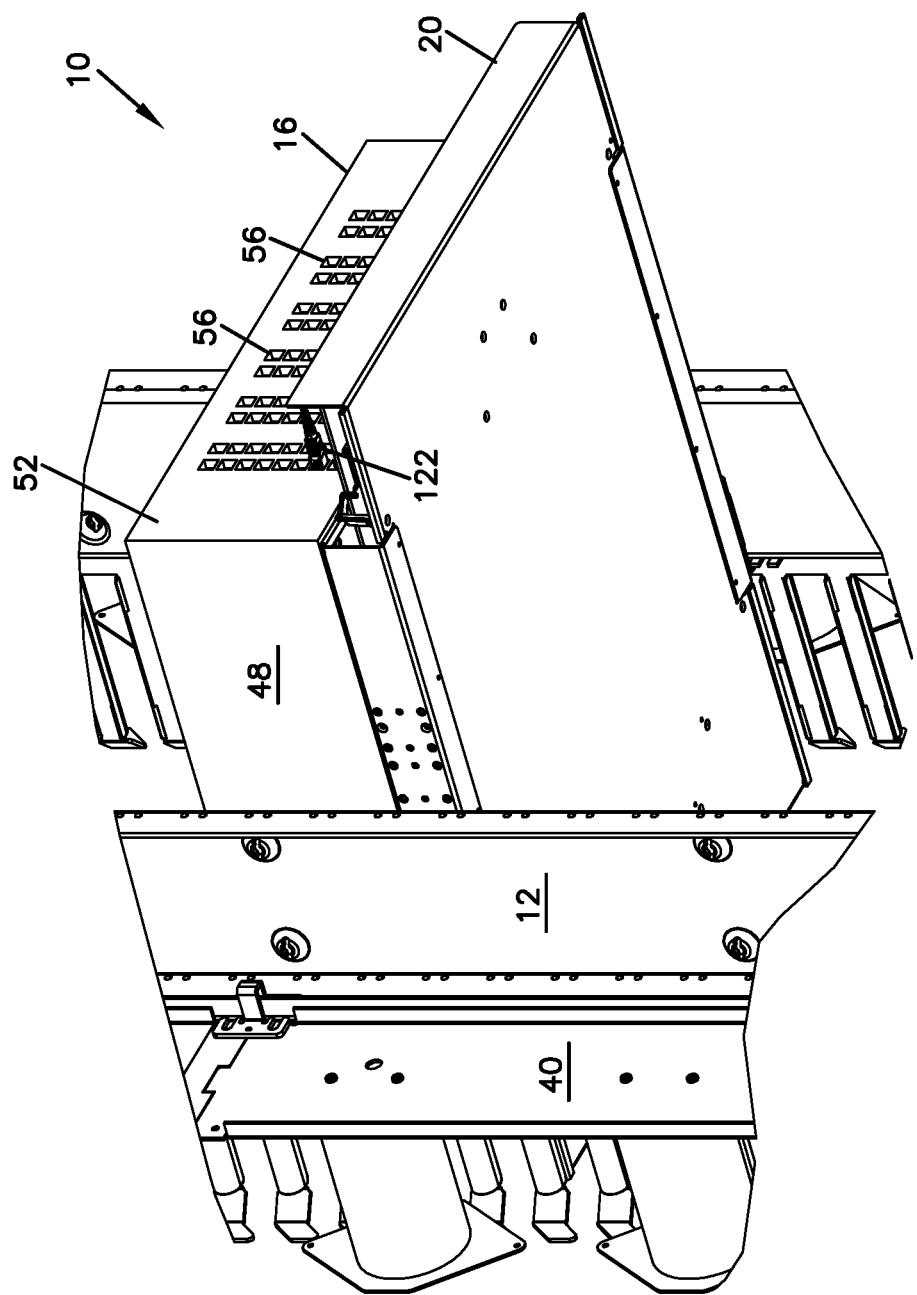
FIG. 3 is a bottom, rear perspective view of the telecommunications system of FIG. 1.
Figure 4:
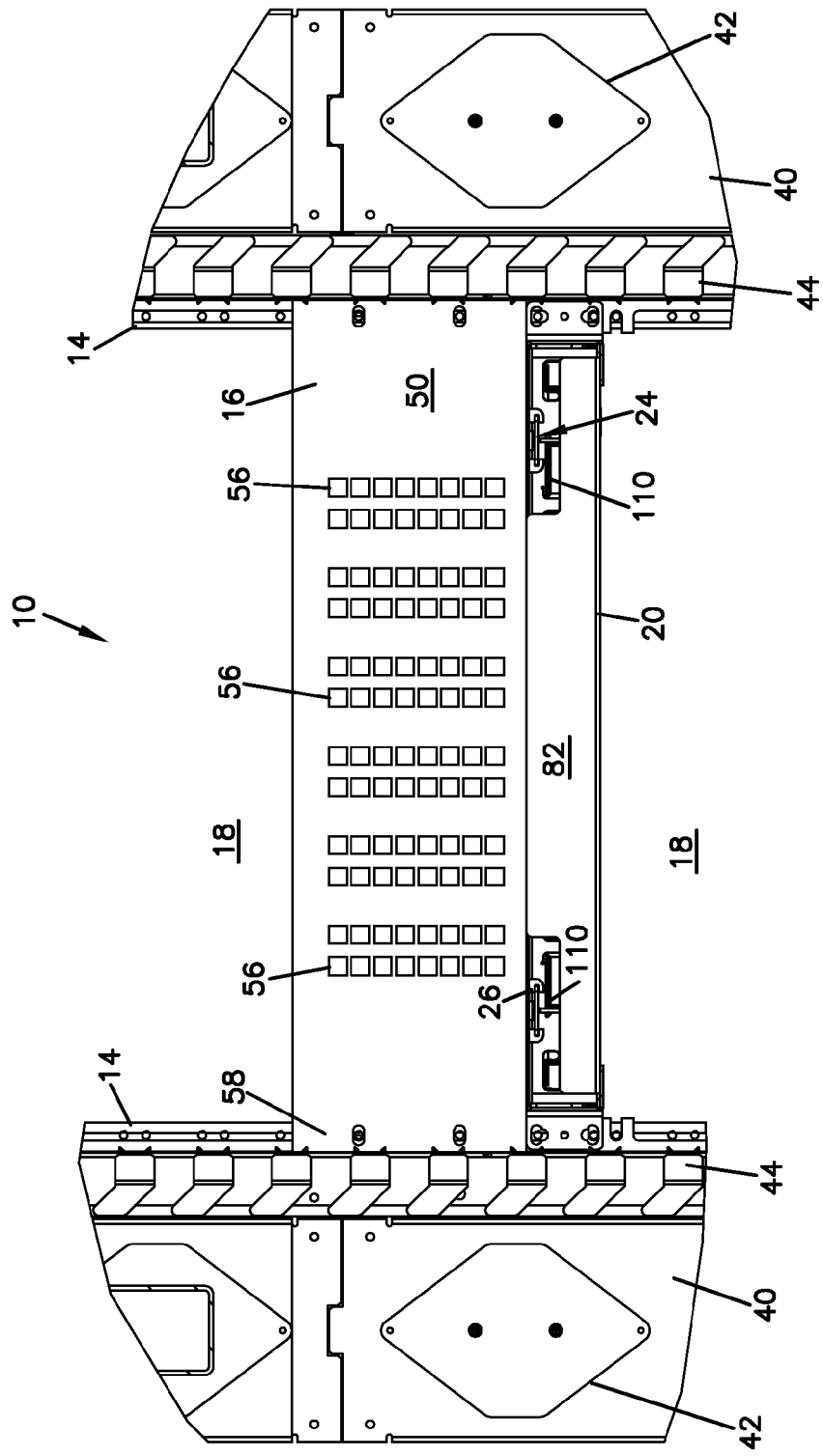
FIG. 4 is a front view of the telecommunications system of FIG. 1.
Figure 5:
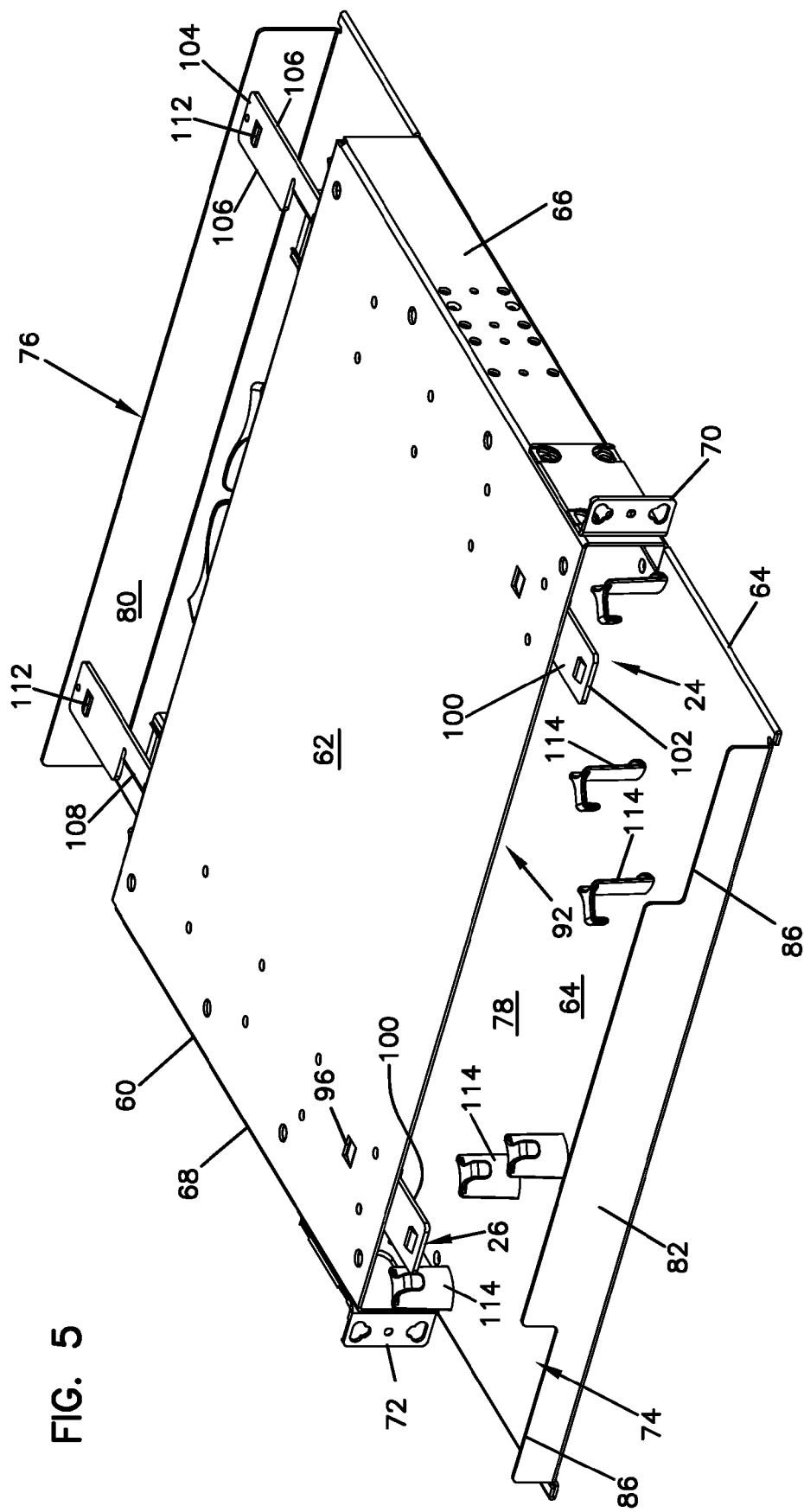
FIG. 5 is a top, front perspective view of the cross-through trough of the telecommunications system of FIG. 1.
Figure 6:
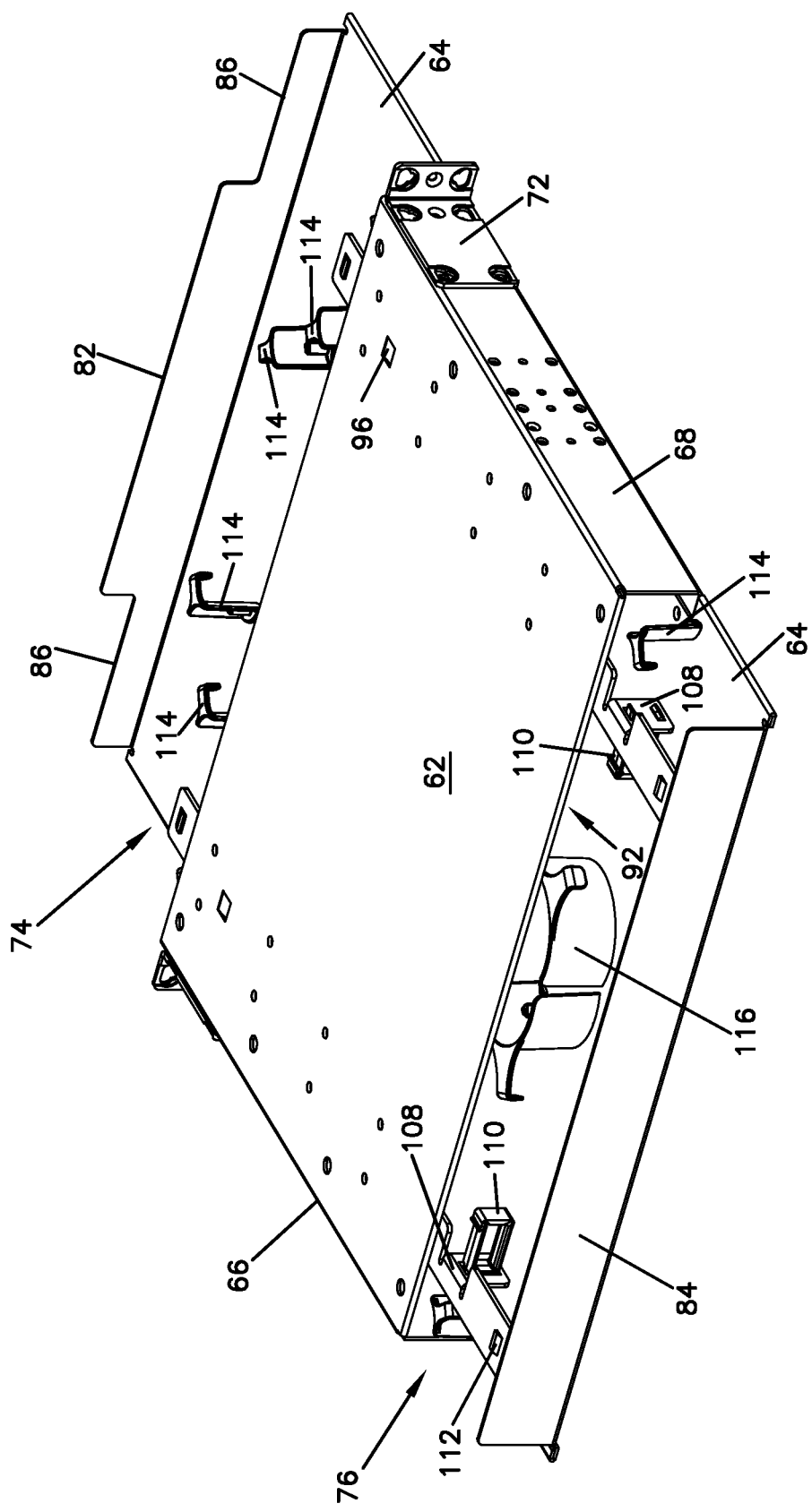
FIG. 6 is a top, rear perspective view of the cross-through trough of FIG. 5.
Figure 7:
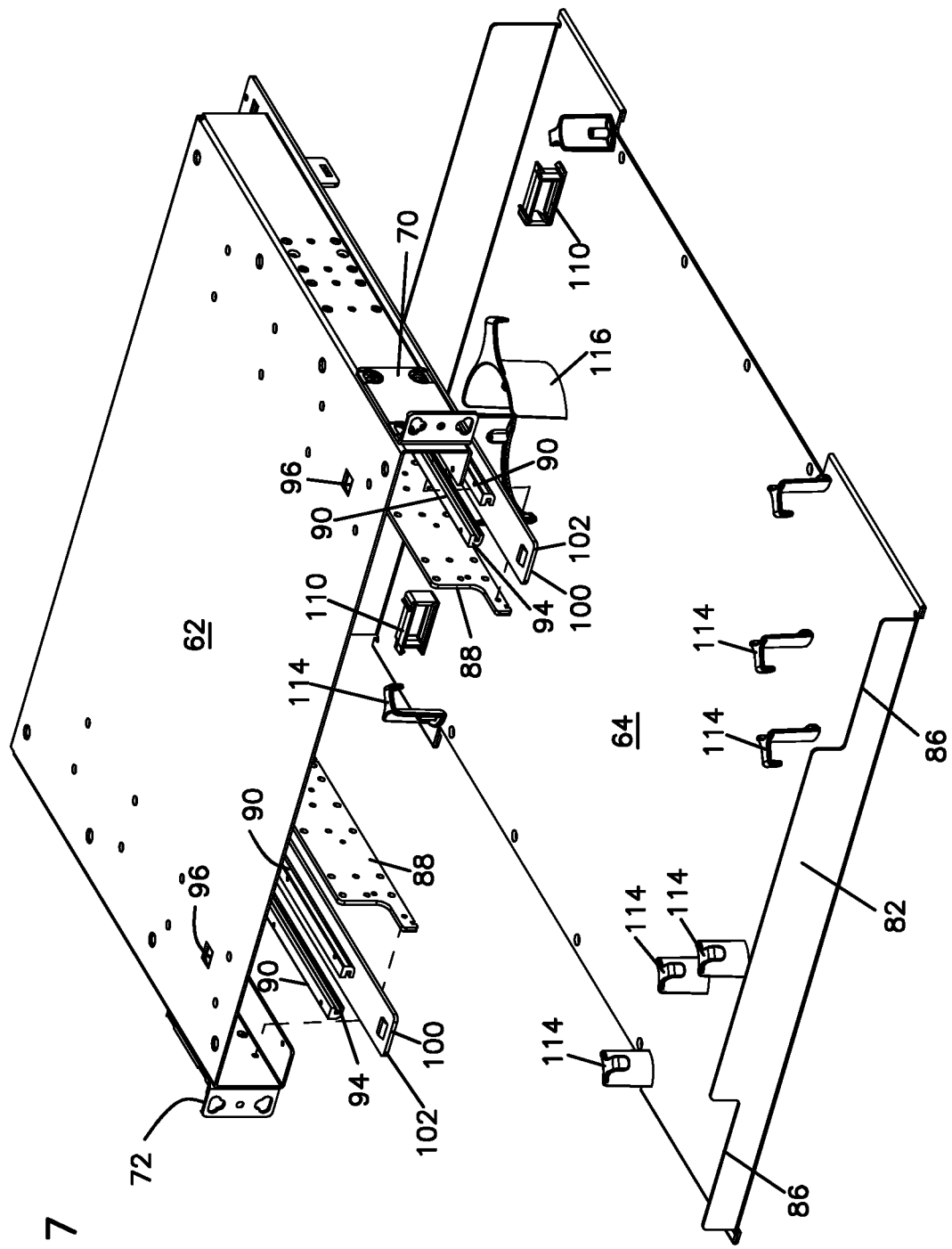
FIG. 7 is an exploded top, front perspective view of the cross-through trough of FIG. 5.

Referring now to FIGS. 1-4, a telecommunications system 10 is shown including a rack 12 with vertical uprights 14 for holding telecommunications equipment 16. In the Figures, only a portion of rack 12 is shown, and only one piece of equipment 16 is shown in rack 12. It is to be appreciated that additional equipment 16, or other equipment can be mounted to rack 12 in space 18.

Telecommunication system 10 also includes a cross-through trough, or trough 20. Trough 20 defines a passage 22 extending from a front 30 to a rear 32 of passage 22. Passage 22 can receive telecommunications cables that need to pass from a front to a rear or from the rear to the front of rack 12. Trough 20 includes a shuttle 24 for use in moving the cable between the front and the rear of passage 22. In a preferred embodiment, a second shuttle 26 is also provided on trough 20. Shuttles 24, 26 are on opposite sides of trough 20. Shuttle 26 is similar in construction and operation to shuttle 24.

The example telecommunications system 10 includes vertical cable management panels 40 including cable management spools 42. Telecommunications system 10 further includes vertical cable guides 44 in the form of a plurality of fingers 46.

Equipment 16 can have various forms. As illustrated, equipment 16 includes a chassis 48 having a front 50, and an opposite rear 52, and side flanges 58 for mounting to rack 12. Adjacent to front 50 of chassis 48 is a plurality of fiber optic adapters 56 for connecting external cables to internal telecommunications cables or components. Rear 52 of chassis 48 also includes adapters 56 for connecting external cables to internal cables or components. In one embodiment, telecommunications equipment 16 is active, meaning that a source of electrical power is provided for operating the internal telecommunications equipment and components. Other equipment can be used with respect to rack 12, including passive equipment (no electrical power).

Referring now to FIGS. 1-7, trough 20 includes a chassis 60 having a top 62, a bottom 64, and sides 66, 68. Chassis 60 includes mounting flanges 70, 72 for mounting to rack 12. Chassis 60 includes a front 74 and a rear 76. As shown in the Figures, bottom 64 is longer than top 62, and includes an exposed front area 78 and an exposed rear area 80.

Bottom 64 of chassis 60 includes a front panel 82 and a rear panel 84. Front panel 82 includes cutouts 86. Chassis 60 further includes two internal support plates 88. Longitudinal guides 90 are positioned in an interior 92 of chassis 60 adjacent to top 62. Longitudinal guides 90 include longitudinal slots 94 for receipt of shuttles 24, 26. Top 62 of chassis 60 includes a tab 96 for cooperating with shuttles 24, 26 to limit sliding movement. Chassis 60 includes interior 92 which defines passage 22 from front 30 to rear 32.

In one implementation, shuttles 24, 26 each include a strip 100 having a front end 102, and a rear end 104. Edges 106 of strip 100 are received in slots 94 of longitudinal guides 90 to permit sliding movement in forward and rearward directions. Strip 100 includes a plate like construction. Strip 100 includes a bent tab 108 for use in attaching a clip 110. Clip 110 is useful for holding a fiber optic cable for pulling the cable from the front to the rear, or the rear to the front. Strip 100 also includes a rear tab 112. Tabs 112 limit forward movement of strips 100 relative to chassis 60. Cutouts 86 allow strips 100 to extend past front panel 82. Rearward movement of strip 100 is limited by engagement of strip 100 with rear panel 84 by engaging tabs 96 in top 62 of chassis 60.

Bottom 64 of chassis 60 includes a plurality of curved radius limiters 114. And a spool 116, for managing cables in trough 20 and preventing excessive bending of the cables.

Figure 8:
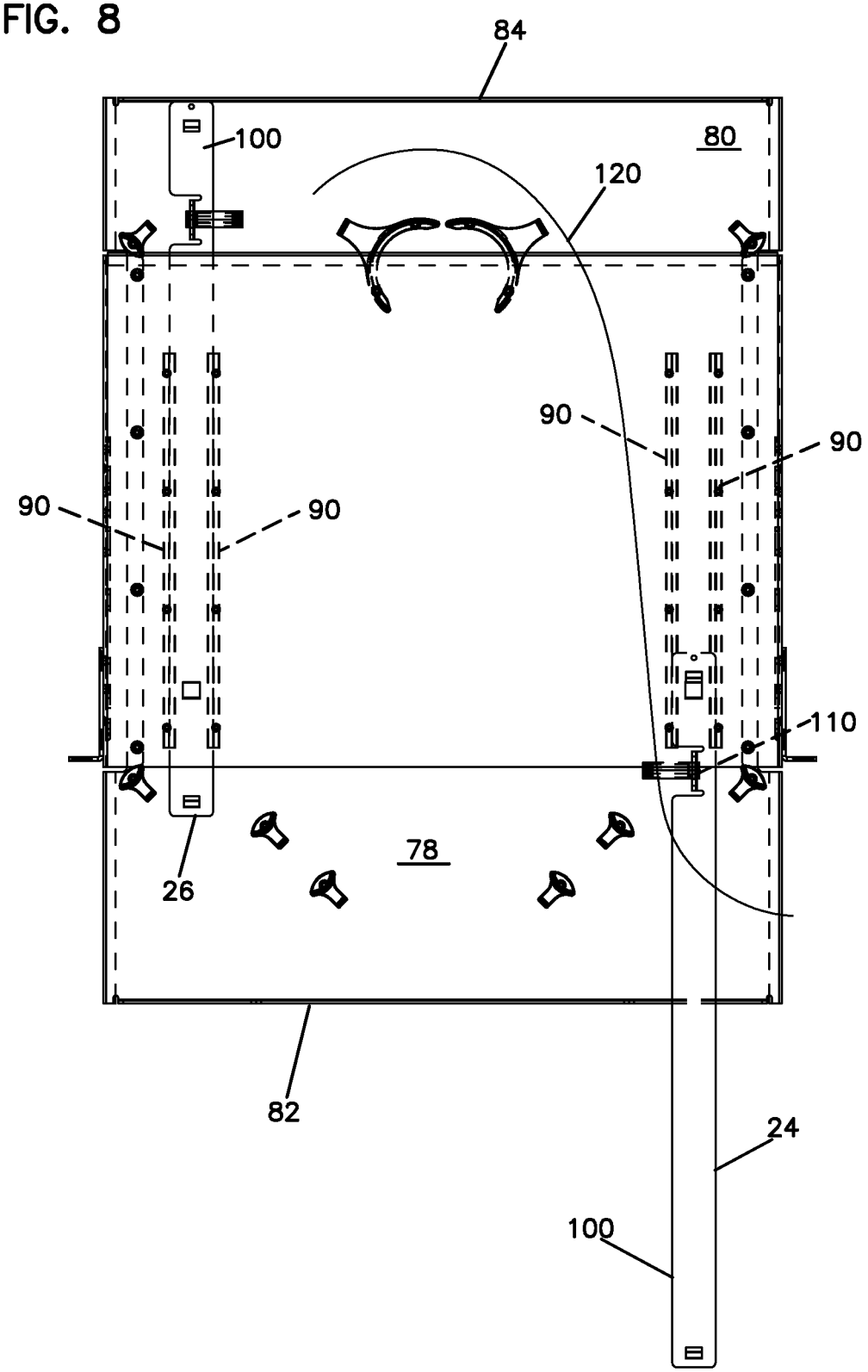
FIG. 8 is a top view of the cross-through trough of FIG. 5, showing a cable being moved from the rear to the front.
Figure 9:
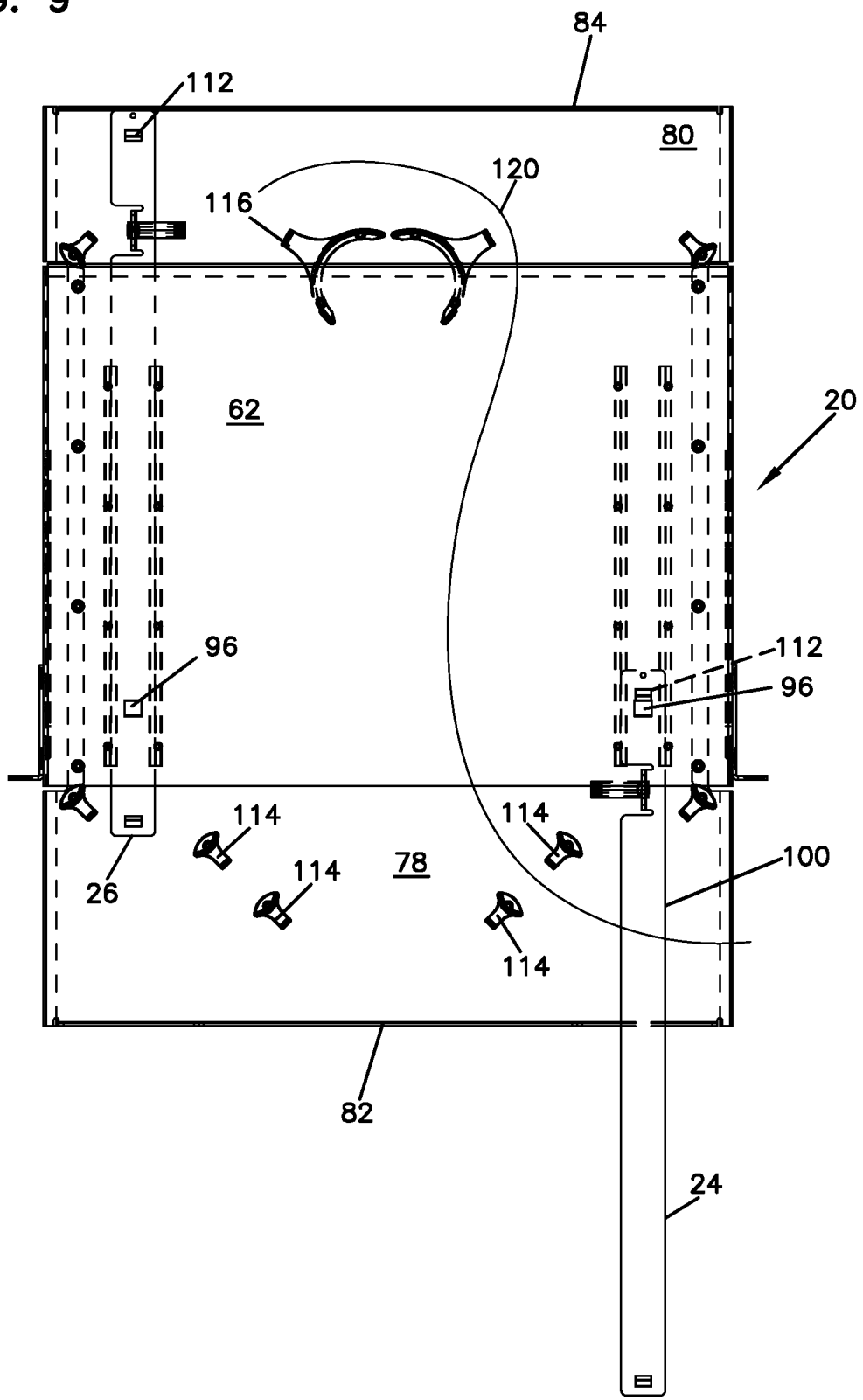
FIG. 9 is a top view similar to FIG. 8, showing the cable being managed by cable management structure on the cross-through trough.
Figure 10:
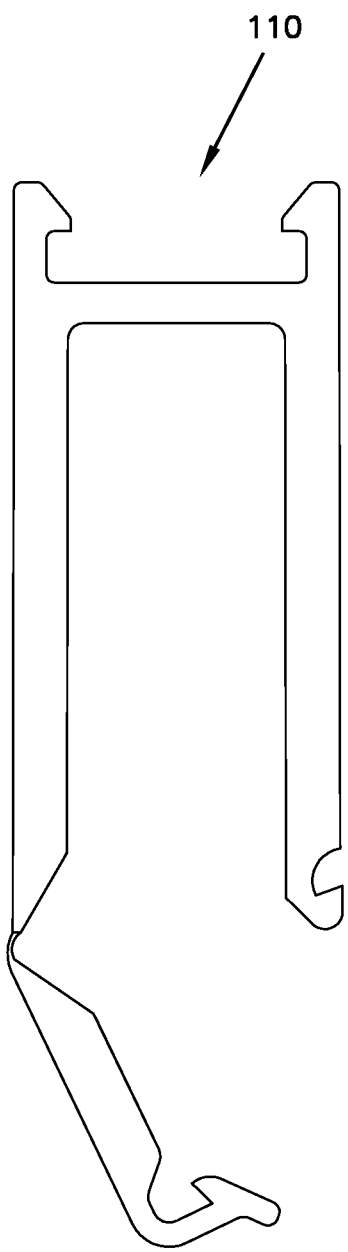
FIG. 10 is an enlarged view of the clip of the shuttle of the cross-through trough.

Referring also now to FIGS. 8 and 9, strip 100 is moved longitudinally to the position shown in FIG. 8 to pull a cable from exposed rear area 80 toward exposed front area 78. Cable 120 is clipped to clip 110 to facilitate bringing forward of the cable 120. Once pulled forward, cable 120 can be removed from clip 110 and managed by one or more of the cable radius limiters 114. Cable 120 can include a connector 122 for connection to equipment 16 at one of adapters 56. Clip 110 is an example of one clip useful for holding the cable during the pulling operation. Clip is shown for example in U.S. Pat. No. 6,771,871, the disclosure of which is hereby incorporated by reference. Clip 110 selectively opens to allow a cable to be held by the clip. FIG. 10 shows example clip 110 in greater detail in the open position. Multiple cables can be moved simultaneously if desired with each shuttle 24, 26.

In one preferred embodiment, trough 20 is one rack unit (RU) tall. One rack unit (RU) is equal to 1.75 inches. With such a height, it may be difficult for a technician to reach through by hand from adjacent front 30 to rear 32 in order to pull a cable from the rear to the front. Also, other external tools which might be able to reach through may be difficult to use or cause damage to the cable.

The above specification, examples and data provide a complete description of the manufacture and use of the inventive aspects of the present disclosure. Since many embodiments of the inventive aspects can be made without departing from the spirit and scope of the disclosure, the inventive aspects reside in the claims hereinafter appended.

The invention claimed is:

1. A telecommunications cross-through trough comprising:
   a chassis including a top, an opposite bottom, and two sides connecting the top to the bottom, the top being spaced from the bottom a distance to define a height of the chassis at one rack unit (RU), the chassis further including a front and a rear;
   wherein the front defines an open front, and wherein the rear defines an open rear, wherein the top, the bottom, and the sides define an interior, wherein the interior is adapted to receive telecommunications cables extending between the open front and the open rear;
   a first sliding shuttle and a second sliding shuttle opposite the first sliding shuttle, the first and second sliding shuttles mounted to the chassis within the interior, the first and second sliding shuttles each including a cable clip, wherein the cable clip is accessible from the front and the rear of the chassis while the top of the chassis remains fastened to the sides of the chassis, wherein the first and second sliding shuttles are moveable longitudinally between the front and the rear of the chassis, wherein the first and second sliding shuttles are adapted to pass a telecommunications cable through the entire chassis between the open front and the open rear, wherein the first and second sliding shuttles are mounted to the top, wherein each of the first and second sliding shuttles are adjacent to one of the sides of the chassis; and
   mounting flanges for mounting the chassis to a telecommunications rack, cabinet, or frame.

2. The trough of claim 1, wherein the bottom of the chassis extends further than the top of the chassis in both the front and the rear of the chassis.

3. The trough of claim 2, further comprising a front flange that extends upward from a bottom chassis adjacent to the front, and wherein the front flange includes cutouts.

4. The trough of claim 2, wherein a rear flange extends upwardly from the bottom adjacent the rear.

5. The trough of claim 1, further comprising curved radius limiters positioned on the bottom of the chassis.

6. The trough of claim 5, wherein at least one of the radius limiters is positioned adjacent to a corner of the bottom of the chassis.

7. The trough of claim 1, further comprising a cable spool position on the bottom of the chassis adjacent to a center line extending between the front and the rear.

\* \* \* \* \*